United States Patent
Han

(10) Patent No.: US 7,343,536 B2
(45) Date of Patent: Mar. 11, 2008

(54) SCAN BASED AUTOMATIC TEST PATTERN GENERATION (ATPG) TEST CIRCUIT, TEST METHOD USING THE TEST CIRCUIT, AND SCAN CHAIN REORDERING METHOD

(75) Inventor: Dong-kwan Han, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 193 days.

(21) Appl. No.: 11/045,207

(22) Filed: Jan. 31, 2005

(65) Prior Publication Data
US 2005/0172192 A1    Aug. 4, 2005

(30) Foreign Application Priority Data
Jan. 31, 2004  (KR)  .................. 10-2004-0006463

(51) Int. Cl.
*G01R 31/28*   (2006.01)
(52) U.S. Cl. .................................................... 714/726
(58) Field of Classification Search ......... 714/100–824
See application file for complete search history.

(56) References Cited

U.S. PATENT DOCUMENTS

2003/0056164 A1    3/2003  Lauga
2003/0115521 A1    6/2003  Rajski et al.
2003/0182604 A1*   9/2003  Hathaway et al. .......... 714/715
2004/0064771 A1*   4/2004  Appinger et al. ........... 714/733
2006/0101316 A1*   5/2006  Wang et al. ................. 714/726
2006/0156122 A1*   7/2006  Wang et al. ................. 714/726

FOREIGN PATENT DOCUMENTS

| JP | 2003-194886 B1 | 7/2003 |
| WO | WO 01/33238 A1 | 5/2001 |

* cited by examiner

*Primary Examiner*—Guy Lamarre
*Assistant Examiner*—Guerrier Merant
(74) *Attorney, Agent, or Firm*—Volentine & Whitt, PLLC

(57) ABSTRACT

A scan based Automatic Test Pattern Generation (ATPG) test circuit, a test method using the test method, and a scan chain reordering method are disclosed. The test circuit tests for scan chains comprising unknown values which could adversely influence a test result. The test circuit uses a scan test point circuit to prevent unknown values from propagating through the test circuit, thus keeping the unknown values from influencing the test result. The reordering method is used where two scan chains comprising an unknown value exist in a single scan cycle so that the unknown values can be located during different clock cycles.

22 Claims, 10 Drawing Sheets

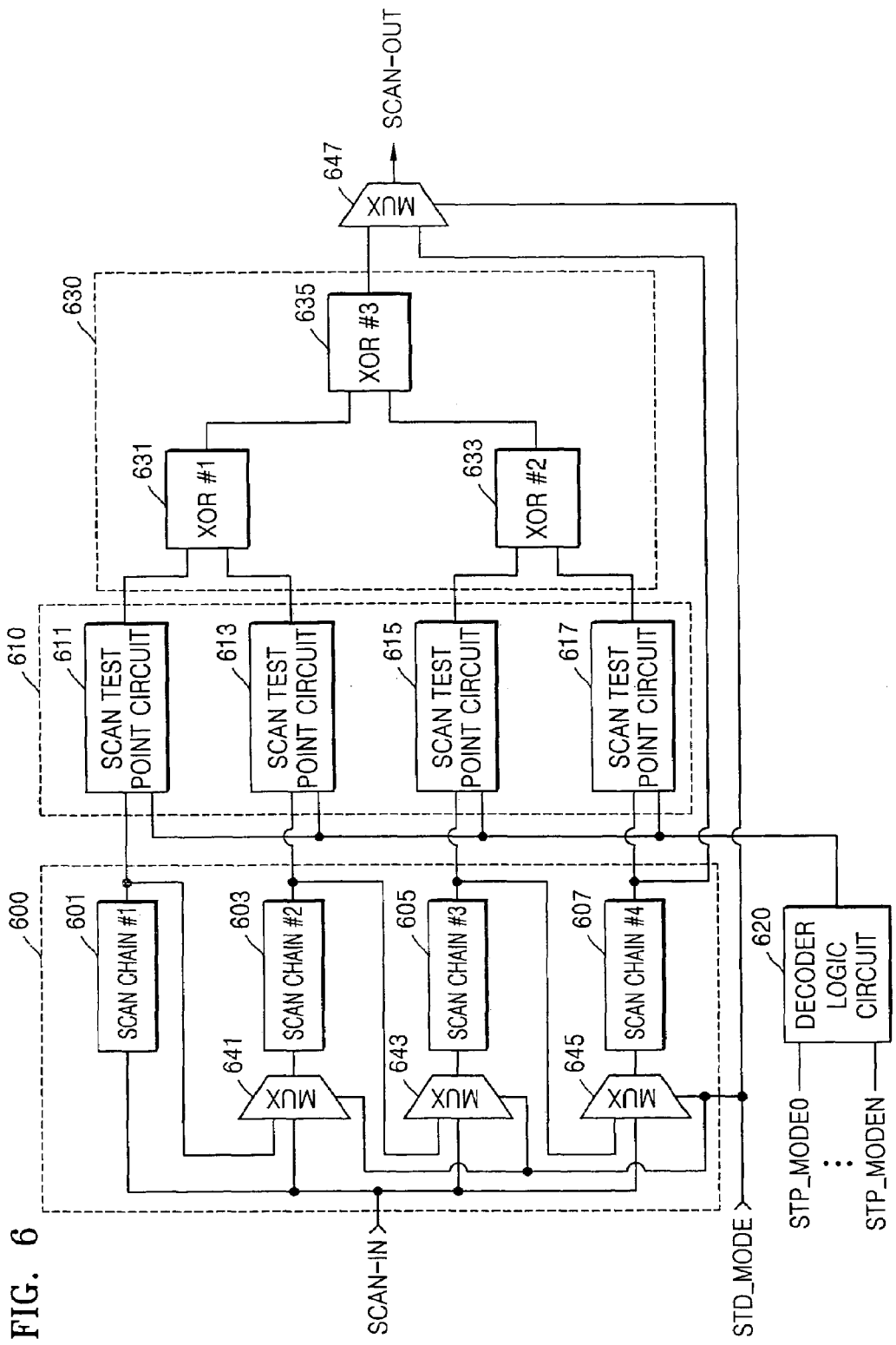

SCAN BASED AUTOMATIC TEST PATTERN GENERATION (ATPG) TEST CIRCUIT, TEST METHOD USING THE TEST CIRCUIT, AND SCAN CHAIN REORDERING METHOD

BACKGROUND OF THE INVENTION

1. Field of the Invention

The invention relates generally to a method of testing semiconductor chips, and more particularly, to a test circuit performing a scan test method for verifying electrical and functional characteristics of a System-on-a-Chip (SOC).

A claim of priority is made to Korean Patent Application No. 10-2004-0006463, filed on Jan. 31, 2004, the disclosure of which is hereby incorporated by reference in its entirety.

2. Description of the Related Art

A test using a scan based Automatic Test Pattern Generation (ATPG) method is performed by connecting a test circuit created by the ATPG method to another circuit and scan-testing the resulting circuit. A scan based ATPG test enables verification of defects in circuits upon product development, thus enabling selection and distribution of products satisfying a particular specification in their electrical and functional characteristics. Since the scan based ATPG test can be automated using an Electronic Design Automation (EDA) tool, this test method is used for the evaluation of most SOCs.

The main factors determining the cost for a scan based ATPG test include the number of scan chains, the number of scan pins, the length of a scan, the volume of scan test data, etc. Considering the above factors, an effective method for reducing test costs will reduce the length of a scan by allowing it to utilize a larger number of scan chains while using a smaller number of scan pins. This approach is intended to reduce a volume of test data and a test time.

The following is an illustration showing a test time associated with a scan based ATPG test. Assume that a SOC device uses 1000 flip flops. The test time for the device must be at least as many clock cycles as the number of flip flops in the device divided by an integer number of scan chains "n" in Automated Test Equipment (ATE) used to perform the test. For example, if the ATE supports three scan chains, the test time must be greater than $$334 \text{ clock cycles} \left( \frac{1000}{\text{number\_of\_scan\_chains}} \right).$$

Accordingly, to perform a pattern set operation, at least 335 (334+1) clock cycles are required. 334 clock cycles are used for shift operations and one clock cycle is used for a capture operation. In order to achieve fault coverage above 95%, a total 3,350,000 nanoseconds (ns) are required according to the following equation 1 if 1000 test pattern sets are required and a period of a test clock is 10 ns.

Test time=1000(test pattern sets)*335(clock cycles)
*10(ns)=3,350,000(ns)    (1)

The amount of test time required by the above method is excessive and hence a method requiring less test time is desired.

FIG. 1 is a diagram showing an example of a conventional scan based ATPG structure.

Referring to FIG. 1, the conventional scan based ATPG structure comprises first through forth scan chains SCAN CHAIN #1 through SCAN CHAIN #4 and eight scan pins, including four scan input pins SCAN-IN and four scan output pins SCAN-OUT. Each scan chain is connected to a scan input pin SCAN-IN and a scan output pin SCAN-OUT. A symbol X shown in third and fourth scan chains SCAN CHAIN #3 and SCAN CHAIN #4 indicates that a certain logic value included in the scan chain is an unknown value.

Testing a highly integrated device such as a SOC using the conventional ATPG structure shown in FIG. 1 requires verification of an enormous amount of test data compared with testing general semiconductor devices. Because the ATE has a limited memory capacity, this causes a significant increase in test costs.

FIG. 2 is a diagram showing a conventional Illinois Scan architecture.

Referring to FIG. 2, the Illinois Scan architecture, as an enhancement of the conventional ATPG structure shown in FIG. 1, comprises first through fourth scan chains SCAN CHAIN #1 through SCAN CHAIN #4, a scan input pin SCAN-IN and four scan output pins SCAN-OUT. The first through fourth scan chains SCAN CHAIN #1 through SCAN CHAIN #4 share a scan input pin SCAN-IN and are respectively connected to the four scan output pins SCAN-OUT. A symbol X shown in third and fourth scan chains SCAN CHAIN #3 and SCAN CHAIN #4 indicates that a certain logic value included in the scan chain is an unknown value.

Since according to the Illinois Scan architecture, all scan chains share one scan input pin SCAN-IN, a total input volume of test data is reduced but a volume of scan output data is the same as in the conventional technique.

FIG. 3 is a diagram showing a scan based ATPG structure as an enhancement of the conventional Illinois Scan architecture shown in FIG. 2.

Referring to FIG. 3, a scan based ATPG structure comprises a scan input pin SCAN-IN, first through fourth scan chains SCAN CHAIN #1 through SCAN CHAIN #4, first through third XOR gates XOR #1, XOR #2, and XOR #3, and a scan output pin SCAN-OUT.

First through third XOR gates XOR #1, XOR #2, and XOR #3 are used to transfer output data from the first through fourth scan chains SCAN CHAIN #1 through SCAN CHAIN #4 to the scan output pin SCAN-OUT, thus substantially compressing the output data of first through fourth scan chains SCAN CHAIN #1 through SCAN CHAIN #4.

First XOR gate XOR #1 receives outputs from scan chains SCAN CHAIN #1 and SCAN CHAIN #2 and second XOR gate XOR #2 receives outputs from scan chains SCAN CHAIN #3 and SCAN CHAIN #4. Third XOR gate XOR #3 receives outputs from first XOR gate XOR #1 and second XOR gate XOR #2. Each XOR gate computes an Exclusive OR function on its inputs and outputs a result of the Exclusive OR function.

Where a conventional scan based ATPG structure is used, an error in a second cycle of second scan chain SCAN CHAIN #2 results in a predetermined signal indicating the error being output through scan output pin SCAN-OUT. Therefore, it is possible to determine whether an error has occurred according to the predetermined signal and perform circuit design modification.

However, where an error is generated in a second cycle of second scan chain SCAN CHAIN #2 and simultaneously an unknown value (hereinafter, referred to as X) exists in a second cycle of the third scan chain SCAN CHAIN #3, a problem arises. In this case, since the output of XOR gate XOR #3 in the second cycle always has unknown value X, the scan output pin SCAN-OUT always outputs unknown value X in the second cycle. Accordingly, in the second cycle, the generation of an error cannot be verified. Cases where unknown value X is generated include a case where a flip flop is un-initialized, a case where a simulation model is a black box, and a case where bus contention causes data collision in buses.

As described above, it is impossible to detect an error in the above cases when using the enhanced scan based ATPG structure shown in FIG. 3.

To effectively address the above-mentioned problems, two approaches have been proposed. A first approach is to prevent unknown value X from being generated. However, this approach has problems in that it creates design/implementation overhead and it requires further implementations and verifications anytime the design is revised. A second approach is to prevent unknown value X from being transferred to a following stage.

SUMMARY OF THE INVENTION

Embodiments of the invention provides a scan based ATPG test circuit capable of testing and diagnosing a plurality of scan chains while preventing unknown values that exist in the scan chains from influencing a test result.

Embodiments of the invention also provides a scan chain reordering method capable of testing and diagnosing a plurality of scan chains while preventing unknown values that exist in the scan chains from influencing a test result.

According to one embodiment, the invention provides a test circuit for verifying electrical and functional characteristics of a product using a scan based Automatic Test Pattern Generation (ATPG) method. The test circuit comprises a scan chain group comprising a plurality of scan chains in which a plurality of sources to be tested are serially connected to each other. The scan chain group receives test data from a predetermined number of scan input pins and outputs scan chain group output signals. The test circuit further comprises a decoder logic circuit decoding a plurality of scan test point mode signals and outputting a decoder logic circuit output signal. The test circuit further comprises a scan test point group receiving the scan chain group output signals, controlling the scan chain group output signals in response to the output signal of the decoder logic circuit, and outputting a plurality of scan test point group output signals, and a scan test data compressor compressing the plurality of scan test point group output signals into a scan test data compressor output signal. The plurality of scan test point mode signals comprises signals comprising information regarding a scan chain having an unknown value whose logic state is not defined. The in information comprises a number of the scan chain having the unknown value and a location of the unknown value within the scan chain.

According to another embodiment, the present invention provides a scan chain reordering method using a test circuit for verifying electrical and functional characteristics of a product using a scan based Automatic Test Pattern Generation (ATPG) method The reordering method comprises defining scan chains having an unknown value whose logic state is not defined, as a first scan chain group and defining scan chains having a value whose logic state is defined as a second scan chain group. Where two scan chains having unknown values exist in a single cycle in the first scan chain group, the method further comprises reordering test sources to form one of two scan chains belonging to the first scan chain group such that the unknown values of the two scan chains exist in a different cycle.

BRIEF DESCRIPTION OF THE DRAWINGS

The accompanying drawings illustrate several selected embodiments of the present invention and are incorporated in and constitute a part of this specification. In the drawings and written description, like reference numerals refer to like elements. In the drawings:

FIG. 6 is a diagram showing a scan based ATPG test circuit according to another embodiment of the invention;

DETAILED DESCRIPTION OF THE INVENTION

The invention will now be described more fully with reference to the accompanying drawings in which several embodiments of the invention are shown.

Figure 1:
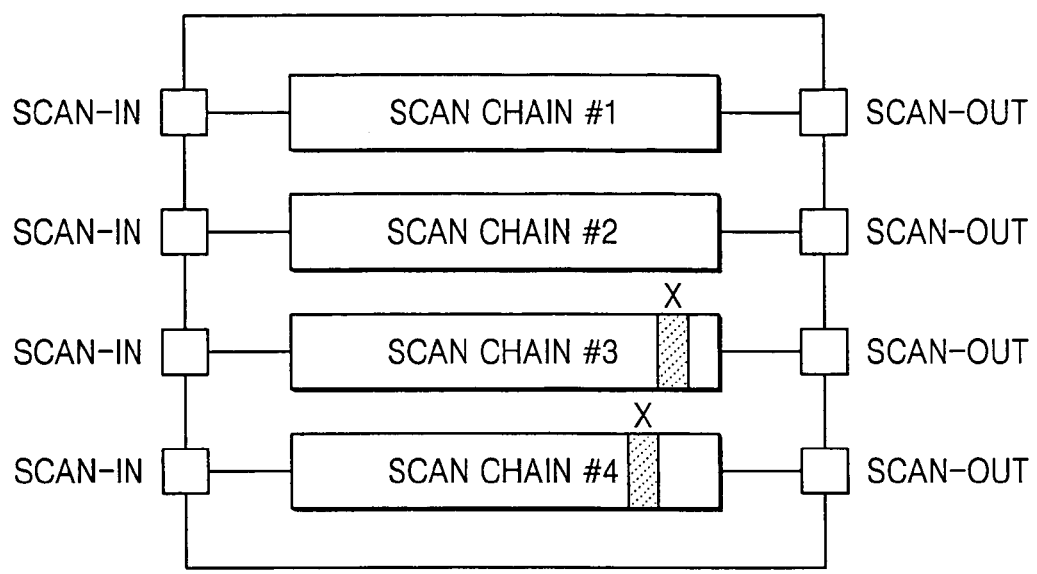
FIG. 1 is a diagram showing an example of a conventional scan based ATPG structure.
Figure 2:
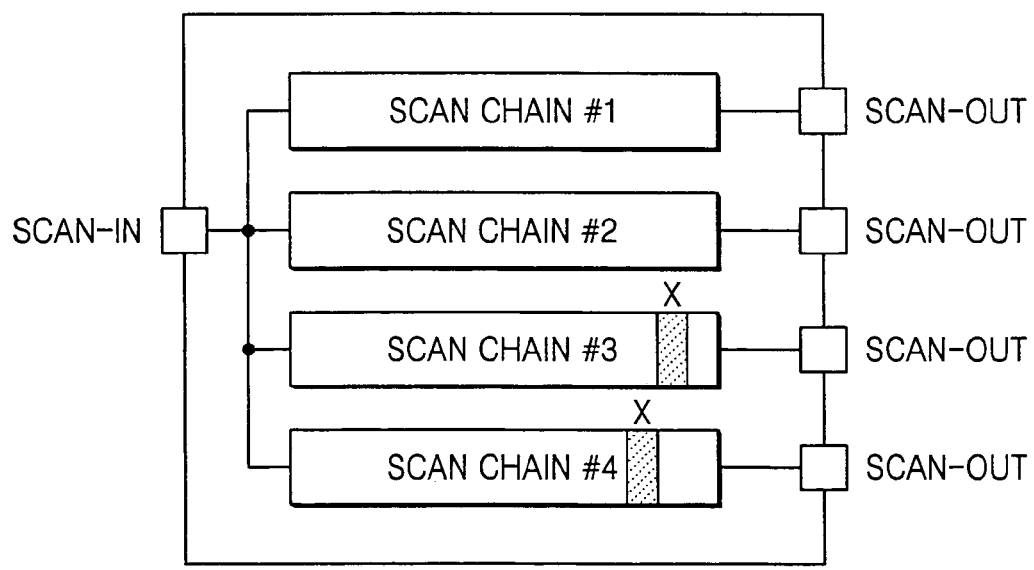
FIG. 2 is a diagram showing a conventional Illinois Scan architecture.
Figure 3:
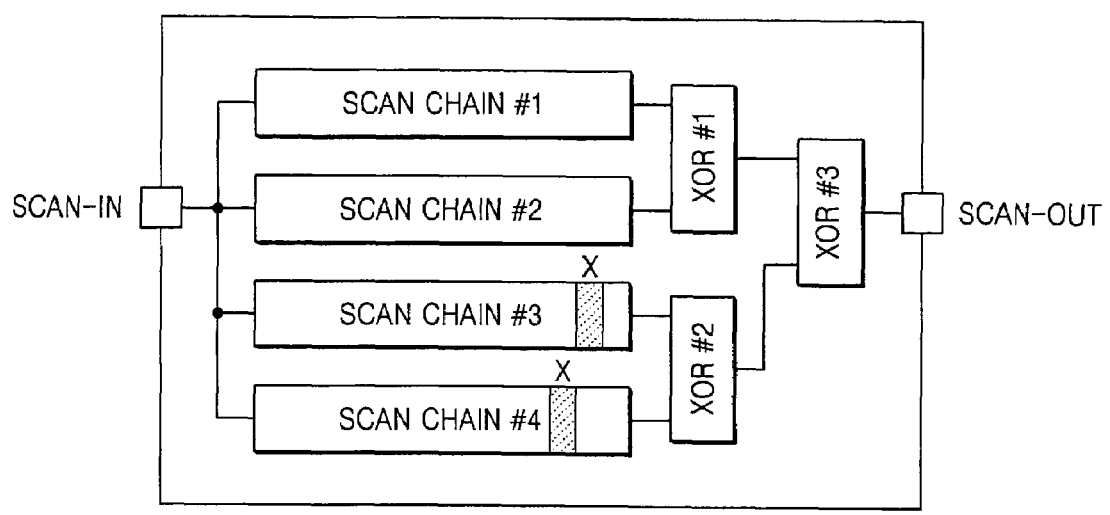
FIG. 3 shows a scan based ATPG structure as an enhancement of the conventional Illinois Scan architecture shown in FIG. 2.
Figure 4:
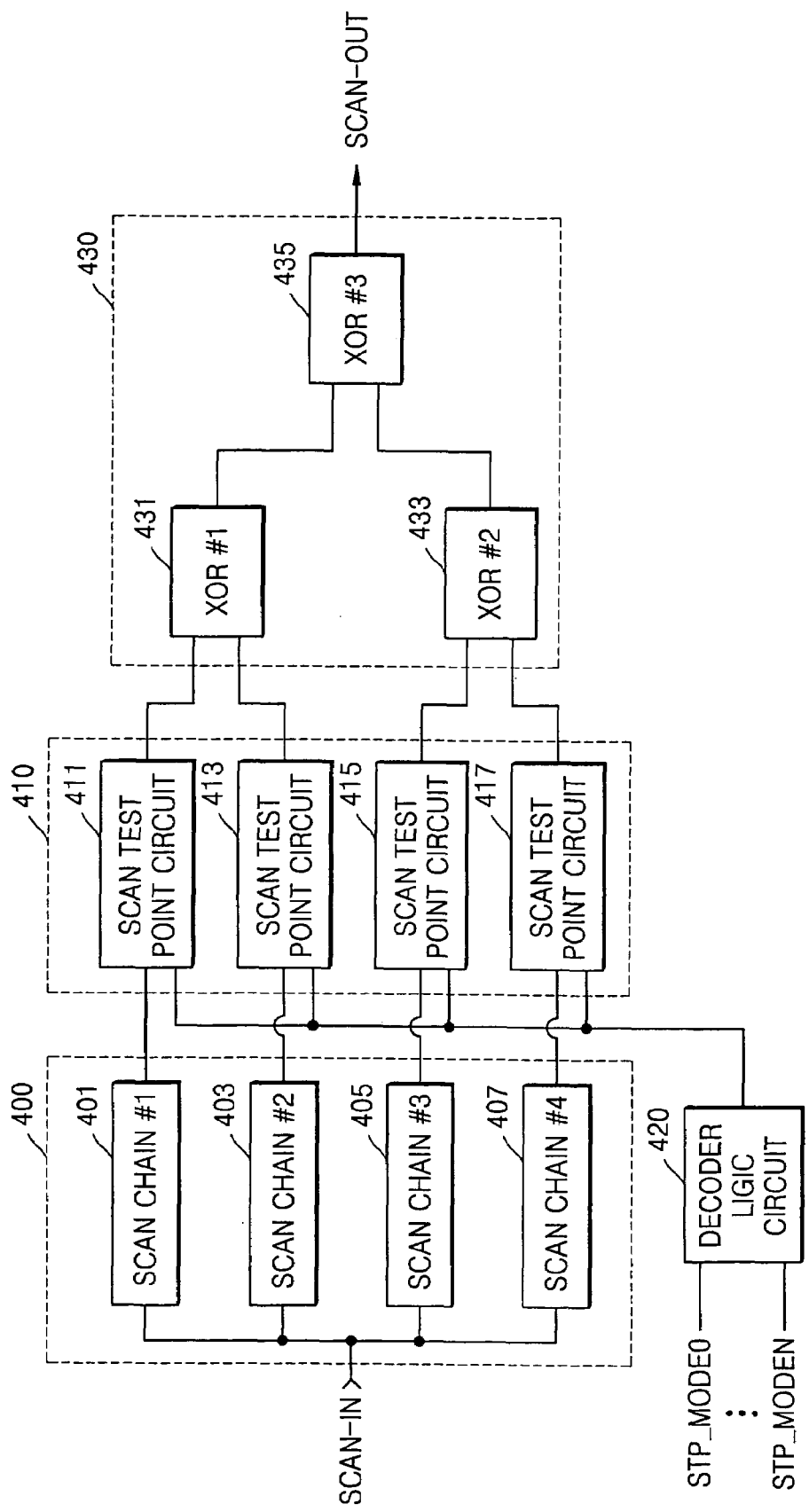
FIG. 4 is a diagram showing a scan based ATPG test circuit according to one embodiment of the invention.

FIG. 4 is a diagram showing a scan based ATPG test circuit according to one embodiment of the invention.

Referring to FIG. 4, the scan based ATPG test circuit comprises a scan input pin SCAN_IN, a scan chain group 400, a scan test point group 410, a decoder logic circuit 420, a scan test data compressor 430, and a scan output pin SCAN-OUT. Test data generated by ATPG is received through scan input pin SCAN-IN.

Scan chain group 400 comprises first through fourth scan chains 401, 403, 405, and 407, also respectively called SCAN CHAIN #1 through SCAN CHAIN #4. First through fourth scan chains 401, 403, 405, and 407 are chains of test sources connected according to a predetermined rule.

Scan test point group 410 comprises first through fourth scan test point circuits 411, 413, 415, and 417. Each scan test point circuit outputs an output signal from a corresponding scan chain according to a decoder logic circuit output signal output by decoder logic circuit 420.

Decoder logic circuit 420 decodes a plurality of scan test point mode signals STP_MODE 0 through STP_MODE N and outputs decoded signals. The decoded signals are transferred to first through fourth scan test point circuits 411, 413, 415, and 417 so as to prevent an unknown value X in the scan chain from being transferred to scan test data compressor 430.

By applying scan based ATPG to the scan chains, it is possible to obtain a scan output value for each scan chain.

By analyzing an ATPG pattern, the following two pieces of information are readily confirmed: (1) the number of a scan chain comprising an unknown value X, and (2) the location of the unknown value X in the scan chain.

By analyzing the above information, it is possible to set values for scan test point mode signals STP_MODE 0 through STP_MODE N such that they are able to prevent an unknown value X in a scan chain from being transferred to scan test data compressor 430.

Scan test data compressor 430 comprises XOR circuits 431, 433, and 435, respectively labeled XOR #1, XOR #2, and XOR #3. Scan test data compressor 430 compresses signals output by scan test point group 410 into a single output signal.

Referring to FIG. 4, an example of operations of a scan based ATPG test circuit according to one embodiment of the present invention will be described as follows.

Suppose an unknown value X exists in a third cycle of third scan chain SCAN CHAIN #3. A scan test point mode signal STP_MODE 0 through STP_MODE N comprising information about the unknown value X is created and transferred to decoder logic circuit 420. Decoder logic circuit 420 controls scan test point circuit 415, which is connected to an output terminal of third scan chain 405, in response to scan test point mode signal STP_MODE 0 through STP_MODE N, so as to prevent the unknown value X in third scan chain 405 from influencing scan output signal SCAN-OUT.

Figure 5A:
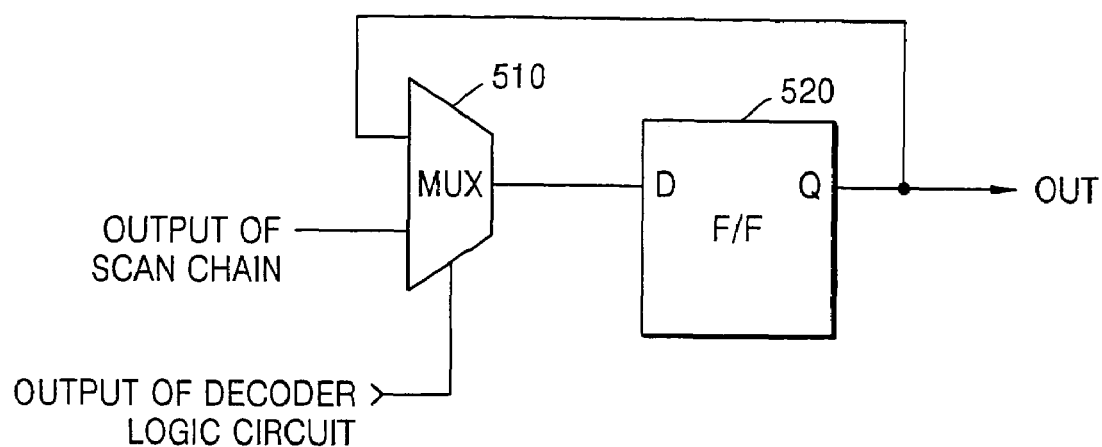
FIGS. 5a and 5b are circuit diagrams illustrating embodiments of a scan test point circuit shown in FIG. 4.
Figure 5B:
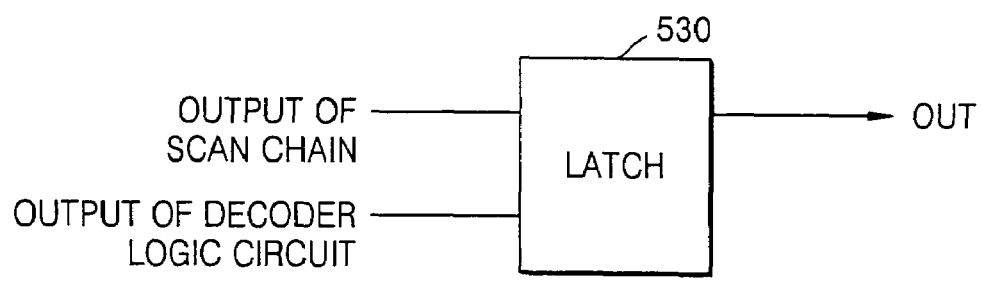

FIGS. 5a and 5b are circuit diagrams illustrating embodiments of the scan test point circuit shown in FIG. 4.

Referring to FIG. 5a, a scan test point circuit is implemented by a scan flip-flop 520 and a multiplexer 510. Where an output of a scan chain is normal, the output of the scan chain is output while being stored in scan flipflop 520 according to an output signal of decoder logic circuit 420. Where an unknown value X is included in the output of the scan chain, data received during a previous clock cycle and stored in scan flipflop 520 is output. In order to accomplish the described functionality, multiplexer 510 receives the output from the scan chain as well as the output of scan flipflop 520 and outputs one of the received signals according to the output signal of the decoder logic circuit 420.

Referring to FIG. 5b, a scan test point circuit is implemented using a latch circuit 530. Where an output of a scan chain is normal, the output of the scan chain is output and latched by latch circuit 530 according to an output signal from decoder logic circuit 420. Where an unknown value X is included in the output of the scan chain, latch circuit 530 outputs data received and latched during a previous clock cycle according to the output signal from decoder logic circuit 420.

In summary, by inserting a scan test point circuit such as those illustrated in FIG. 5a or 5b between each scan chain and scan test data compressor 430, it is possible to prevent an unknown value X among test response data from being transferred to scan test data compressor 430.

Figure 7:
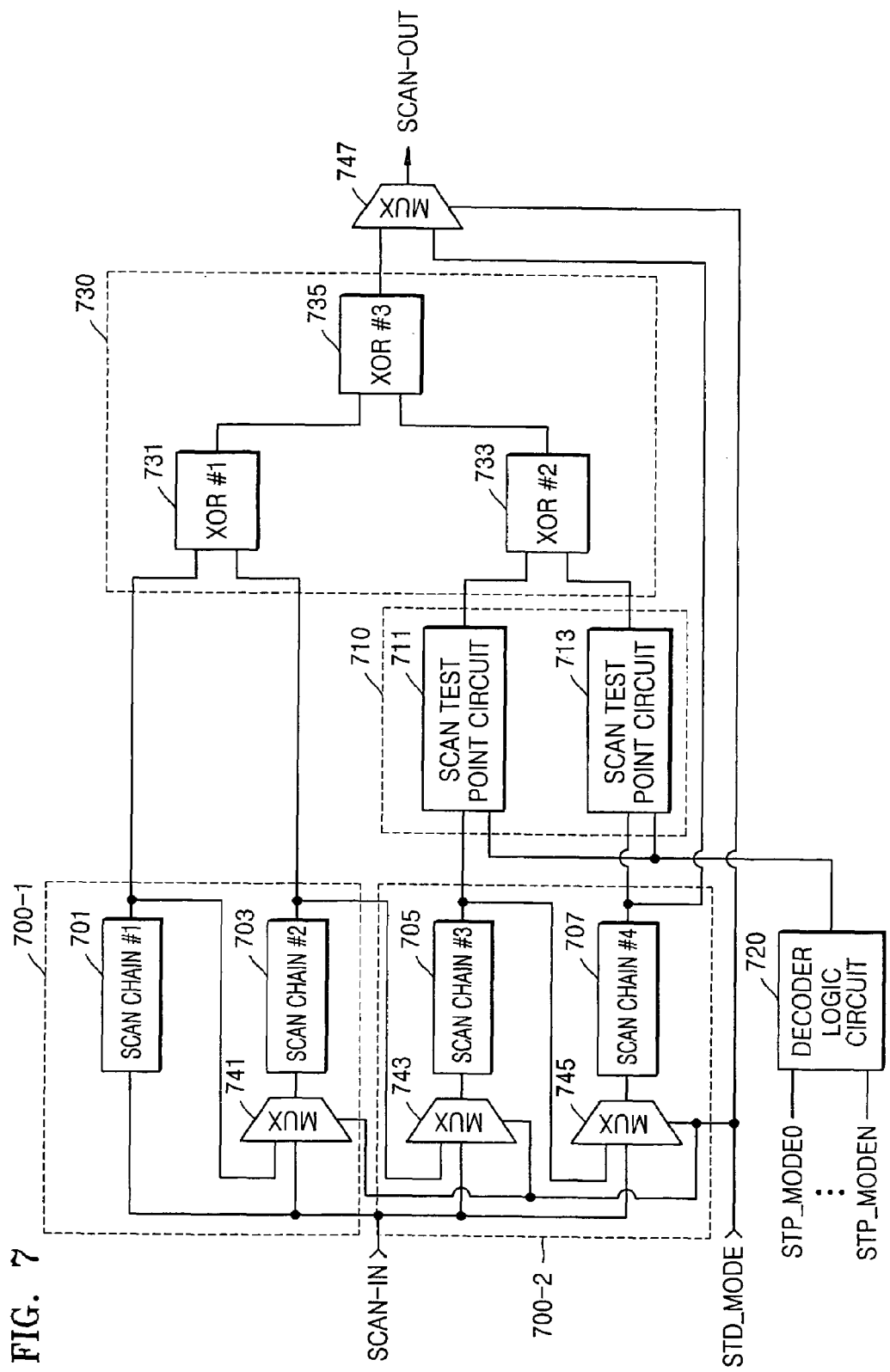
FIG. 7 is a diagram showing a scan based ATPG test circuit according to a still another embodiment of the invention.

According to another embodiment of the present invention, a scan based ATPG test circuit uses a combination of the scan based ATPG test circuit in FIG. 4 and a scan based ATPG test circuit shown in FIG. 7. The scan based ATPG test circuit according to this embodiment has a structure obtained by combining a scan test point group structure in FIG. 4 with a scan test point group structure in FIG. 7.

FIG. 6 is a diagram showing a scan based ATPG test circuit according to yet another embodiment of the present invention.

Referring to FIG. 6, the scan based ATPG test circuit comprises a scan input pin SCAN-IN, a mode selection signal STD_MODE, a scan chain group 600, a decoder logic circuit 620, a data compressor 630, and a first multiplexer 647. Scan input pin SCAN-IN receives test data generated by ATPG. Mode selection signal STD_MODE sets a scan test mode or a scan diagnosis mode.

Scan chain group 600 includes a plurality of scan chains 601, 603, 605, and 607, also labeled SCAN CHAIN #1 through SCAN CHAIN #4. Each of scan chains 601, 603, 605, and 607 outputs a respective scan chain output signal. In scan chain group 600, a plurality of sources to be tested are serially connected to each other. Scan chain group 600 receives test data from scan input pin SCAN-IN in response to mode selection signal STD_MODE.

Scan chain group 600 includes first through fourth scan chains 601, 603, 605, and 607 and second through fourth multiplexers 641, 643, and 645.

First scan chain 601 receives test data through scan input pin SCAN-IN and outputs a first scan chain output signal.

Second multiplexer 641 selectively outputs one among test data apparent at scan input pin SCAN-IN and the first scan chain output signal as a second multiplexer output signal based on mode selection signal STD_MODE. Second scan chain 603 receives the second multiplexer output signal and outputs a second scan chain output signal.

Third multiplexer 643 selectively outputs one among the test data apparent at scan input pin SCAN-IN and the second scan chain output signal as a third multiplexer output signal based on mode selection signal STD_MODE. Third scan chain 605 receives the third multiplexer output signal and outputs a third scan chain output signal.

Fourth multiplexer 645 selectively outputs one among the test data apparent at scan input pin SCAN-IN and the third scan chain output signal as a fourth multiplexer output signal based on mode selection signal STD_MODE. Fourth scan chain 607 receives the fourth multiplexer output signal and outputs a fourth scan chain output signal.

Scan chain group 600 outputs the outputs of scan chains 601, 603, 605, and 607 according to a mode selection signal STD_MODE. In other words, where mode selection signal STD_MODE sets a scan diagnosis mode, scan chain group 600 outputs the outputs of the scan chains 601, 603, 605, and 607 in parallel. Where mode selection signal STD_MODE set the scan diagnosis mode, scan chain group 600 outputs the outputs of the plurality of scan chains 601 through 607 through a final scan chain 607 created by serially connecting the scan chains. Through diagnosis of the signal output by scan chain 607, a number and location of a scan chain comprising an error can be detected.

Scan test point group 610 comprises a number of scan test point circuits 611, 613, 615, and 617. The number of scan test point circuits is equal to the number of scan chains in scan chain group 600. Scan test point group 610 controls and outputs the outputs of scan chain group 600 in response to an output of decoder logic circuit 620.

Each of scan test point circuits 611, 613, 615, and 617 receives an output from a scan chain in scan chain group 600 and either passes the output through or stores the output, or outputs a previously received output signal from the scan chain in response to an output signal of decoder logic circuit 620. Scan test point circuit 611, 613, 615, and 617 are typically implemented using a scan test point circuit such as those shown in FIG. 5a or 5b.

Decoder logic circuit 620 decodes a plurality of scan test point mode signals STP_MODE 0 through STP_MODE N.

The plurality of scan test point mode signals STP_MODE 0 through STP_MODE N are signals comprising information regarding a scan chain having an unknown value X whose logic state is not defined. The information contained in the plurality of scan test point mode signals includes a number of the scan chain having the unknown value X and a location of the unknown X in the scan chain.

In order to generate the plurality of scan test point mode signals STP_MODE 0 through STP_MODE N, a scan test mode signal generation unit (not shown) is typically provided. The scan test mode signal generation unit typically receives data subjected to ATPG, and generates the plurality of scan test mode signals.

Scan test data compressor 630 compresses a plurality of output signals of test point group 610 into a single output signal. Scan test data compressor 630 has the same configuration as a conventional scan test data compressor.

First multiplexer 647 selectively outputs one among an output of scan test data compressor 630 or an output of scan chain 607 based on mode selection signal STD_MODE.

FIG. 7 is a diagram showing a scan based ATPG test circuit according to still another embodiment of the present invention.

Referring to FIG. 7, the scan based ATPG test circuit comprises a scan input pin SCAN-IN, a first scan chain group 700-1, a second scan chain group 700-2, a scan test point group 710, a decoder logic circuit 720, a data compressor 730, and a first multiplexer 747. Scan input pin SCAN-IN receives test data generated by ATPG. A mode selection signal STD_MODE sets a scan test mode or a scan diagnosis mode.

First scan chain group 700-1 receives test data from scan input pin SCAN-IN, responds to mode selection signal STD_MODE, and comprises a plurality of scan chains 701 and 703 comprising sources whose logic states are defined.

First scan chain group 700-1 comprises a first scan chain 701 receiving test data apparent at scan input pin SCAN_IN and having an output. First scan chain group 700-1 further comprises a second multiplexer 741 receiving as inputs test data apparent at scan input pin SCAN-IN and the output of first scan chain 701 and selectively outputting one of its inputs based on mode selection signal STD_MODE. First scan chain group 700-1 further comprises a second scan chain 703 receiving an output from second multiplexer 741 and having an output.

Second scan chain group 700-2 receives test data apparent at scan input pin SCAN-IN, responds to a mode selection signal STD_MODE, and comprises a plurality of scan chains 705 and 707 comprising sources having unknown values X whose logic states are not defined. Second scan chain group 700-2 further comprises a third multiplexer 743 and a fourth multiplexer 745.

Third multiplexer 743 receives as inputs test data apparent at scan input pin SCAN-IN and the output of scan chain 703 and selectively outputs one of its inputs based on mode selection signal STD_MODE. Scan chain 705 receives an output of third multiplexer 743, and has an output. Fourth multiplexer 745 receives as inputs data apparent at scan input pin SCAN-IN and the output of scan chain 705 and selectively outputs one of its inputs based on mode selection signal STD_MODE. Scan chain 707 receives an output of fourth multiplexer 745 and has an output.

Scan chain groups 700-1 and 700-2 output the outputs of scan chains 701, 703, 705, and 707 in the case that mode selection signal STD_MODE indicates scan test mode. However, where mode selection signal STD_MODE indicates scan diagnosis mode, scan chain groups 700-1 and 700-2 output an output of a final scan chain 707 created by serially connecting the plurality of scan chains.

Decoder logic circuit 720 decodes a plurality of scan test point mode signals STP_MODE 0 through STP_MODE N. The plurality of scan test point mode signals STP_MODE 0 through STP_MODE N are signals comprising information regarding a scan chain having an unknown value X whose logic state is not defined. The information contained in scan test point mode signals STP_MODE 0 through STP_MODE N includes a number of the scan chain having the unknown value X and a location of the unknown value X in the scan chain.

Scan test point group 710 receives the outputs of scan chains 705 and 707 and an output from decoder logic circuit 720. Scan test point group 710 outputs either the outputs of scan chains 705 and 707 or previously received and stored output values from scan chains 705 and 707 based on the output of decoder logic circuit 720. Scan test point group 710 comprises scan test point circuits 711 and 713. Each of scan test point circuits 711 and 713 either allows an output signal received from a corresponding scan chain to pass through it or outputs a signal output by the corresponding scan chain during a previous clock cycle based on an output signal of decoder logic circuit 720.

Scan test data compressor 730 receives output signals from scan chains 701 and 703 in first scan chain group 700-1 and scan test point circuits 711 and 713 in scan test point group 710 and compresses the received output signals into a single output signal.

First multiplexer 747 selectively outputs either an output from scan test data compressor 730 or the output signal of scan chain 707 based on mode selection signal STD_MODE.

According to the embodiment of the scan based ATPG test circuit according to FIG. 7, two scan test point circuits are omitted as compared to the scan based ATPG test circuit according to the embodiment shown in FIG. 6. As described above, it is possible to obtain a higher test data compression ratio, by specifically including data from sources where there is a high probability of comprising an unknown value X in scan chains 705 and 707 and connecting scan test point circuits only to output terminals of scan chain 705 and 707.

Figure 8:
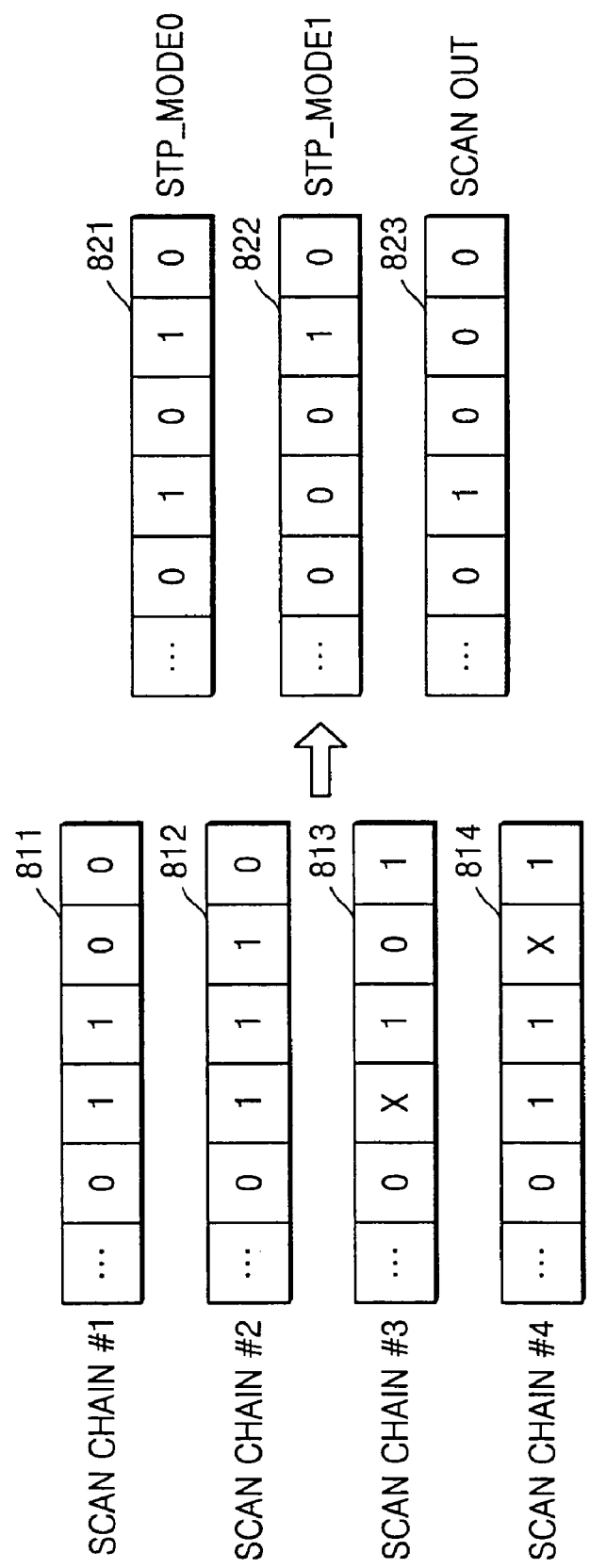
FIG. 8 is a view explaining a value of a scan test point mode signal STP_MODE which is decided according to an output of a scan chain.

FIG. 8 is a view explaining a value of a scan test point mode signal STP_MODE which is decided based on an output of a scan chain.

Referring to FIG. 8, an unknown value X is included in a fourth cycle of a third scan chain 813, also labeled SCAN CHAIN #3. Simultaneously, another unknown value X is included in a second cycle of a fourth scan chain 814, also labeled SCAN CHAIN #4.

Suppose that a unique number for a first scan chain 811 is "00", a unique number for a second scan chain 812 is "01", a unique number for third scan chain 813 is "10", and a unique number for fourth scan chain 814 is "11". In order to represent a number of a scan chain having an unknown value X and a location of the unknown value X in the scan chain, a unique number "11" is designated in second cycles of scan test point mode signals 821 and 822, also labeled STP_MODE0 and STP_MODE1. A unique number "10" is designated in fourth cycles of scan test point mode signals 821 and 822, thereby preventing the unknown value X from being transferred to an output terminal 823, also labeled SCAN OUT.

A previously stored logic value is output as an output value of a corresponding scan chain instead of unknown value X in the second and fourth cycles, so as to prevent unknown value X in the scan chain from influencing a final scan output.

As described above, to obtain a higher test data compression ratio, the following conditions should be satisfied. According to a first condition, scan chains comprising an unknown value X must be separated from scan chains not comprising an unknown value X. According to a second condition, two or more unknown values X must not be generated simultaneously during a scan cycle in a plurality of scan chains.

The first condition is satisfied in the above-described embodiments. However, in order to satisfy the second condition, a reordering method is proposed and described herein.

Figure 9:
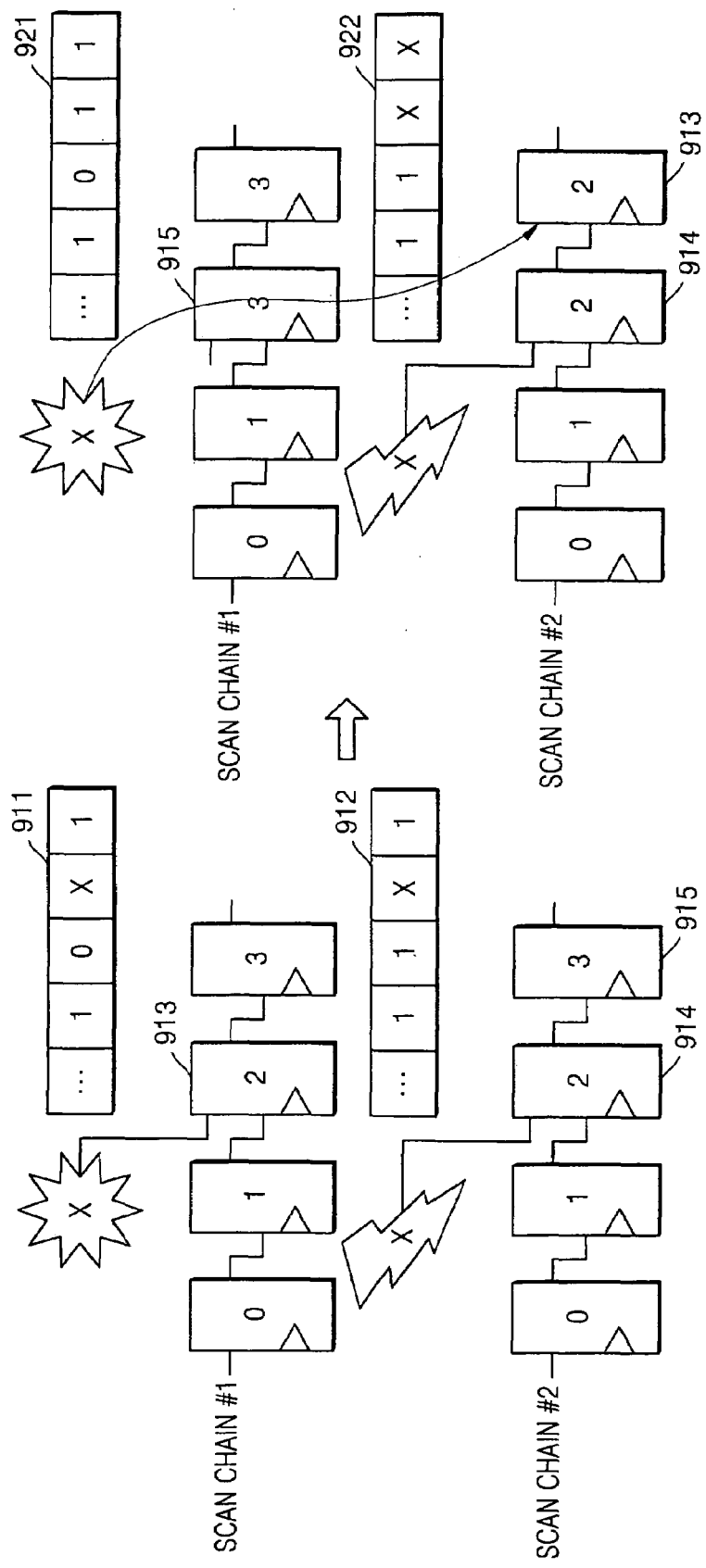
FIG. 9 is a view explaining a method of reordering scan chains, according to one embodiment of the invention.

FIG. 9 is a view describing a method of reordering scan chains, according to one embodiment of the present invention.

Referring to FIG. 9, a method of reordering scan chains is described. Using the method of reordering scan chains, scan chains are reordered to operate as if flipflops 913 and 914, which both contain an unknown value X, exist in a single scan chain even though flipflops 913 and 914 with the unknown value exist in a plurality of scan chains.

Where test data generated by ATPG indicates that an unknown value X exists in a second flipflop 913 in a scan chain SCAN CHAIN #1 and another unknown value X exists in a second flipflop 914 in a scan chain SCAN CHAIN #2, the first condition described above is readily satisfied by reordering an output value of second flipflop 913 in scan chain SCAN CHAIN #1 into an output value 922 in second flipflop 914 in scan chain SCAN CHAIN #2 using an artificial manipulation. In other words, second flipflop 913 in scan chain SCAN CHAIN #1 with the unknown value X is transposed with a flipflop 915 in scan chain SCAN CHAIN #2 without unknown value X, so that no unknown value X exists in outputs of scan chain SCAN CHAIN #1 and unknown value X is reordered as an output value 922 in scan chain SCAN CHAIN #2.

Figure 10:
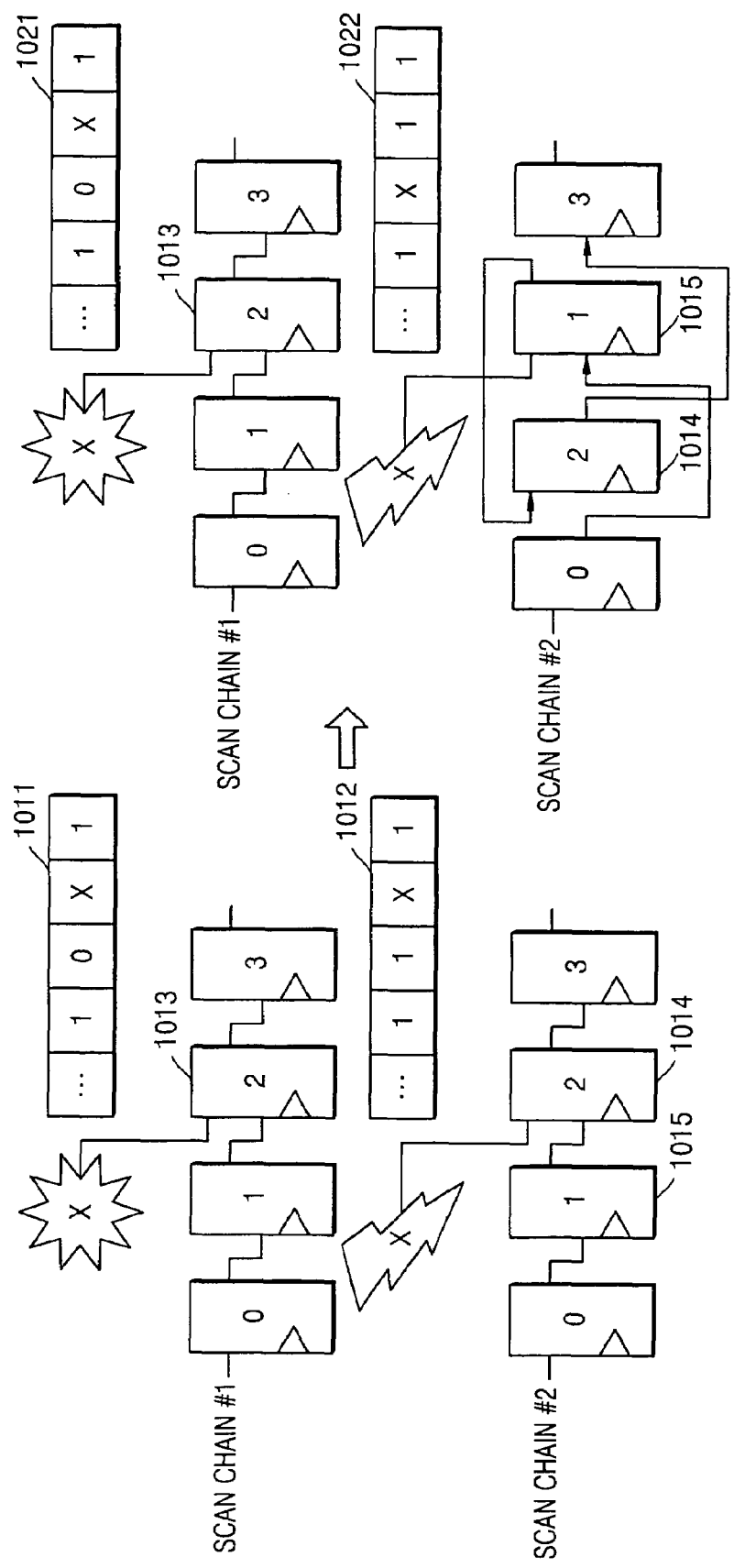
FIG. 10 is a view for explaining a method of reordering scan chains, according to another embodiment of the invention; and, FIG. 11 is a flowchart illustrating a scan based ATPG test method according to one embodiment of the invention.

FIG. 10 is a view explaining a method of reordering scan chains, according to another embodiment of the present invention.

Referring to FIG. 10, a reordering method used when two scan chains comprising an unknown value X exist in a single scan cycle, is described.

Where an unknown value X exists in second cycles of scan chains SCAN CHAIN #1 and scan chain SCAN CHAIN #2, an external manipulation is performed so that an output value of a flipflop 1014 in scan chain SCAN CHAIN #2 is not output at the same time as an output value in second flipflop 1013 in scan chain SCAN CHAIN #1. In other words, by transposing flipflop 1014 second scan chain SCAN CHAIN #2 with flipflop 1015 in scan chain SCAN CHAIN #2, it is possible to locate the unknown values X included in the outputs of scan chain SCAN CHAIN #1 and scan chain SCAN CHAIN #2 respectively during different clock cycles.

Figure 11:
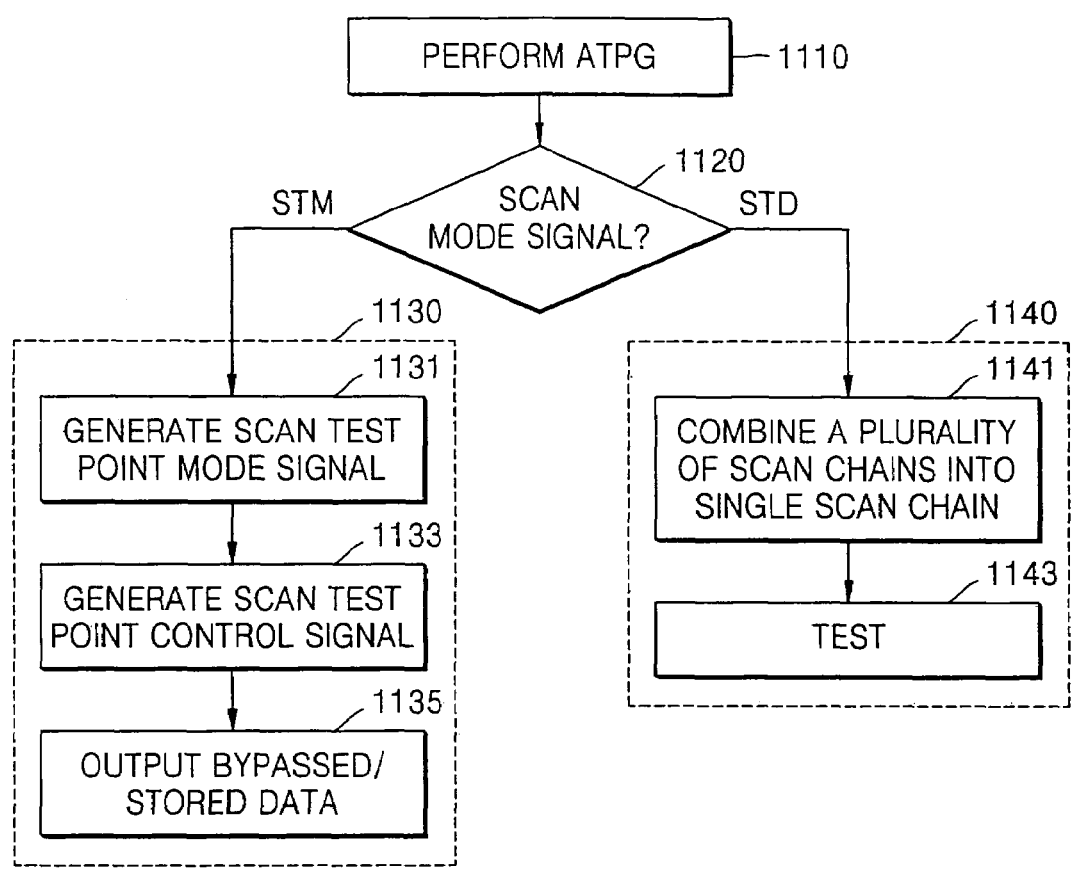

FIG. 11 is a flowchart illustrating a scan based ATPG test method according to an embodiment of the present invention.

Referring to FIG. 11, the scan based ATPG test method comprises performing ATPG, (step 110), receiving and determining a scan mode signal (step 1120), performing a scan test (step 1130), and performing a scan diagnosis (step 1140). The test method is used for verifying electrical and functional characteristics of a product using a scan based ATPG method.

In step 1110, a test pattern is generated using ATPG. In step 1120, a scan mode signal is received and it is determined whether the scan mode signal sets a scan test mode (STM) or a scan diagnosis mode (STD).

If the scan mode signal sets the scan test mode (STM), a scan test is performed in step 1130. The scan test comprises generating a scan test point mode signal (step 1131) creating a scan test point control signal (step 1133), and bypassing data or outputting stored data (step 1135).

In step 1131, a scan test point mode signal is generated. The scan test point mode signal is a signal including information regarding a scan chain comprising an unknown value whose logic state is not defined, wherein the information includes a number of the scan chain comprising the unknown value and a location of the unknown value in the scan chain. In step 1133, the scan test point mode signal is decoded to create a scan test point control signal. In step 1135, an output signal of a scan chain is bypassed and an output value of the scan chain received and stored before a clock pulse is output, according to the scan test point control signal.

In step 1140, which is performed when the scan mode signal indicates scan diagnosis mode (STD), a location of a test source with an error is detected among test sources forming a scan chain.

In step 1140, a plurality of scan chains are typically grouped into a single scan chain (step 1141), and electrical and functional characteristics of the single scan chain are tested so that an error location in the scan chain is detected (step 1143).

According to the present invention, a scan cycle and a number of a scan chain with an error are detected using a serialized scan chain method. The serialized scan chain method is divided into scan test mode and scan diagnosis mode.

In scan diagnosis mode, output values of a scan chain are compressed by a data compressor and are tested by the scan based ATPG method so that it is detected whether or not an error exists in the output values. In scan diagnosis mode, all scan chains are serially connected to form a single chain. Through an output signal of a final scan chain of the single chain, a number and a scan cycle of a scan chain with an error are detected.

If a scan test point group is used, it is possible to reduce an amount of test data exponentially. The above-described case shows a case where a number of scan test point circuits is the same a number of scan chains, however, it is possible to use fewer scan test point circuits under a specific condition. Generally, a location of data comprising an unknown value X is nearly constant due to a circuit design rule and typical system characterstics. Therefore, by including data having an unknown value X, that is, error-sensitive data in as small of a number of scan chains as possible and connecting a scan test point circuit only to output terminals of those scan chains, the number of control signals STP_MODE used in scan test point mode can be reduced.

Table 1 shows advantages of using the scan based ATPG test circuit and the scan chain reordering method according to the present invention.

TABLE 1

| STP_MODE | SCAN OUT | SCAN CHAIN NUMBER | Note |
|---|---|---|---|
| 3 | 1 | 8-5 | X2 |
| 4 | 1 | 16-9 | X3 |
| 5 | 1 | 32-17 | X4 |

TABLE 1-continued

| STP_MODE | SCAN OUT | SCAN CHAIN NUMBER | Note |
|---|---|---|---|
| 6 | 1 | 64-33 | X9 |
| 7 | 1 | 128-65 | X14 |
| 7 | 3 | 128-65 | X12 |

Referring to Table 1, where 7 scan test point mode signals STP_MODE are used, 27 scan chains can be selected. Also, where test data for the 27 scan chains is compressed using three XOR trees, a test time can be reduced to about $\frac{1}{12}$ of the test time where no compression is used.

In the above description, four scan chains were used in the scan based ATPG test circuit. However, in practice, a scan based ATPG test circuit can include four or more scan chains.

As described above, according to the present invention, it is possible to significantly reduce a volume of test data and a number of test channels. Also, it is possible to reduce test costs by 10 times or more compared to an existing scan based ATPG vector. Furthermore, the present invention does not influence normal operation of a system due to low design overhead.

The foregoing preferred embodiments are teaching examples. Those of ordinary skill in the art will understand that various changes in form and details may be made to the exemplary embodiments without departing from the scope of the present invention which is defined by the following claims.

What is claimed is:

1. A test circuit adapted for use with a scan based Automatic Test Pattern Generation (ATPG) method, the test circuit comprising:
    a scan chain group comprising a plurality of scan chains adapted to connect a plurality of sources, the scan chain group receiving test data from a predetermined number of scan input pins and outputting scan chain group output signals;
    a decoder logic circuit decoding a plurality of scan test point mode signals and outputting a decoder logic circuit output signal;
    a scan test point group outputting a plurality of scan test point group output signals in relation to the scan chain group output signals and the decoder logic circuit output signal; and,
    a scan test data compressor compressing the plurality of scan test point group output signals into a scan test data compressor output signal;
    wherein the plurality of scan test point mode signals comprises signals comprising information regarding a scan chain having an unknown value, the information comprising a number of the scan chain having the unknown value and a location of the unknown value within the scan chain,
    wherein the scan test point group comprises a plurality of scan test point circuits; and
    wherein each of the scan test point circuits receives a signal output by a corresponding scan chain and the decoder logic circuit output signal and either outputs the signal output by the corresponding scan chain or outputs a stored output signal received from the corresponding scan chain in a previous clock cycle in response to the decoder logic circuit output signal.

2. The test circuit of claim 1,
    wherein the plurality of scan test point circuits comprises a number of scan test point circuits equal to a number of scan chains in the plurality of scan chains.

3. The test circuit of claim 2, wherein each of the scan test point circuits comprises:
    a multiplexer selectively outputting a signal output corresponding to a scan chain and a signal output by a flipflop as a multiplexer output signal based on the decoder logic circuit output signal, wherein the flipflop receives, stores, and outputs the multiplexer output signal.

4. The test circuit of claim 2, wherein each of the scan test point circuits comprises:
    a latch circuit transferring the signal output by the corresponding scan chain or the output signal from the corresponding scan chain received in the previous clock cycle in response to the decoder logic circuit output signal.

5. The test circuit of claim 1, further comprising:
    a scan test mode signal generation unit receiving data subjected to ATPG, and generating a plurality of scan test mode signals;
    wherein the plurality of scan test mode signals include information regarding a scan chain comprising an unknown value, the information comprising a number of the scan chain comprising the unknown value and a location of the unknown value in the scan chain.

6. A test circuit adapted for use with a scan based Automatic Test Pattern Generation (ATPG) method, the test circuit comprising:
    a first scan chain group receiving test data from a scan input pin and outputting first scan chain group output signals, the first scan chain group comprising a plurality of scan chains comprising sources whose logic states are defined;
    a second scan chain group receiving test data from the scan input pin and outputting second scan chain group output signals, the second scan chain group comprising a plurality of scan chains comprising one or more sources whose logic states are not defined;
    a decoder logic circuit decoding a plurality of scan test point mode signals and outputting a decoder logic circuit output signal;
    a scan test point group receiving the second scan chain group output signals, controlling the received second scan chain group output signals in response to the decoder logic circuit output signal, and outputting a plurality of scan test point group output signals; and,
    a scan test data compressor receiving the first scan chain group output signals and the plurality of scan test point group output signals and compressing the received signals into a scan test data compressor output signal,
    wherein the plurality of scan test point mode signals contain information regarding a scan chain comprising an unknown value whose logic state is not defined, wherein the information comprises a number of the scan chain comprising the unknown value and a location of the unknown value in the scan chain.

7. The test circuit of claim 6, wherein the scan test point group comprises a plurality of scan test point circuits;
    wherein the plurality of scan test point circuits comprises a number of scan test point circuits equal to a number of scan chains in the plurality of scan chains in the second scan chain group; and,
    wherein each of the scan test point circuits receives a signal output by a corresponding scan chain and the decoder logic circuit output signal and either outputs the signal output by the corresponding scan chain or outputs a stored output signal received from the corresponding scan chain in a previous clock cycle, in response to the decoder logic circuit output signal.

8. The test circuit of claim 7, wherein each of the scan test point circuits comprises:
a multiplexer selectively outputting a signal output from the corresponding scan chain and a signal output by a flipflop as a multiplexer output signal based on the decoder logic circuit output signal, wherein the flipflop receives, stores, and outputs the multiplexer output signal.

9. The test circuit of claim 7, wherein each of the scan test point circuits comprises:
a latch circuit transferring the signal output by the corresponding scan chain or the output signal from the corresponding scan chain received in the previous clock cycle, in response to the decoder logic circuit output signal.

10. The test circuit of claim 6, further comprising:
a scan test mode signal generation unit receiving data subjected to ATPG, and generating a plurality of scan test mode signals;
wherein the plurality of scan test mode signals include information regarding a scan chain comprising an unknown value whose logic state is not defined, the information comprising a number of the scan chain comprising the unknown value and a location of the unknown value in the scan chain.

11. A test circuit adapted for use with a scan based Automatic Test Pattern Generation (ATPG) method, the test circuit comprising:
a mode selection signal indicating a scan test mode or a scan diagnosis mode;
a scan chain group comprising a plurality of scan chains in which a plurality of sources to be tested are serially connected one to another, the scan chain group receiving test data from a predetermined number of scan input pins in response to the mode selection signal, and outputting scan chain group output signals;
a decoder logic circuit decoding a plurality of scan test point mode signals and outputting a decoder logic circuit output signal;
a scan test point group receiving the scan chain group output signals, controlling the scan chain group output signals in response to the decoder logic circuit output signal, and outputting a plurality of scan test point group output signals;
a scan test data compressor compressing the plurality of scan test point group output signals into a scan test data compressor output signal; and,
a first multiplexer selectively outputting one among the scan test data compressor output signal and a final scan chain group output signal as a first multiplexer output signal based on the mode selection signal;
wherein the first multiplexer outputs the scan test compressor output signal if the mode selection signal indicates the scan test mode, and outputs the final scan chain group output signal, which is output by a final scan chain in the scan chain group, if the mode selection signal indicates the scan diagnosis mode; and,
wherein the plurality of scan test point mode signals are signals comprising information regarding a scan chain having an unknown value whose logic state is not defined, the information comprising a number of the scan chain having the unknown value and a location of the unknown value in the scan chain.

12. The test circuit of claim 11, wherein the scan chain group comprises:
a first scan chain receiving the test data and outputting a first scan chain output signal;
a second multiplexer selectively outputting one among the test data and the first scan chain output signal as a second multiplexer output signal based on the mode selection signal;
a second scan chain receiving the second multiplexer output signal and outputting a second scan chain output signal;
a third multiplexer selectively outputting one among the test data and the second scan chain output signal as a third multiplexer output signal based on the mode selection signal;
a third scan chain receiving the third multiplexer output signal and outputting a third scan chain output signal;
a fourth multiplexer selectively outputting one among the test data and the third scan chain output signal as a fourth multiplexer output signal base on the mode selection signal; and,
a fourth scan chain receiving the fourth multiplexer output signal and outputting a fourth scan chain output signal.

13. The test circuit of claim 11, wherein the scan test point group comprises a plurality of scan test point circuits;
wherein the plurality of scan test point circuits comprises a number of scan test point circuits equal to a number of scan chains in the plurality of scan chains; and,
wherein each of the scan test point circuits receives a signal output by a corresponding scan chain and the decoder logic circuit output signal and either outputs the signal output by the corresponding scan chain or outputs a stored output signal received from the corresponding scan chain in a previous clock cycle, in response to the decoder logic circuit output signal.

14. The test circuit of claim 13, wherein each of the scan test point circuits comprises:
a fifth multiplexer selectively outputting one among the signal output by the corresponding scan chain and a signal output by a flipflop as a fifth multiplexer output signal based on the decoder logic circuit output signal; wherein the flipflop receives, stores, and outputs the fifth multiplexer output signal.

15. The test circuit of claim 13, wherein each of the scan test point circuits comprises:
a latch circuit transferring the signal output by the corresponding scan chain or the output signal from the corresponding scan chain received in the previous clock cycle, in response to the decoder logic circuit output signal.

16. The test circuit of claim 11, further comprising:
a scan test mode signal generation unit receiving data subjected to ATPG, and generating a plurality of scan test mode signals;
wherein the plurality of scan test mode signals include information regarding a scan chain comprising an unknown value whose logic state is not defined, the information comprising a number of the scan chain comprising the unknown value and a location of the unknown value in the scan chain.

17. A test circuit adapted for use with a scan based Automatic Test Pattern Generation (ATPG) method, the test circuit comprising:
a mode selection signal indicating a scan test mode or a scan diagnosis mode;

a first scan chain group comprising a plurality of scan chains comprising sources whose logic states are defined, the first scan chain group receiving test data from a scan input pin in response to the mode selection signal and outputting first scan chain group output signals;

a second scan chain group comprising a plurality of scan chains comprising sources each with unknown values whose logic state are not defined, the second scan chain group receiving test data from the scan input pin in response to the mode selection signal and outputting second scan chain group output signals;

a decoder logic circuit decoding a plurality of scan test point mode signals and outputting a decoder logic circuit output signal;

a scan test point group receiving the second scan chain group output signals, controlling the second scan chain group output signals in response to the decoder logic circuit output signal, and outputting a plurality of scan test point group output signals;

a scan test data compressor receiving an output signal from the first scan chain group and the plurality scan test point group output signals and compressing the received signals to an scan test data compressor output signal; and, a first multiplexer selectively outputting one among the scan test data compressor output signal and a final second scan chain group output signal from the scan chain group based on the mode selection signal;

wherein the first multiplexer outputs the scan test compressor output signal if the mode selection signal indicates the scan test mode, and outputs the final second scan chain group output signal, which is output by a final scan chain in the second scan chain group, if the mode selection signal indicates the scan diagnosis mode; and, the plurality of scan test point mode signals are signals comprising information regarding a scan chain having an unknown value whose logic state is not defined, the information comprising a number of the scan chain having the unknown value and a location of the unknown value in the scan chain.

18. The test circuit of claim 17, wherein the first scan chain group comprises:
a first scan chain receiving the test data and outputting a first scan chain output signal;
a second multiplexer selectively outputting one among the test data and the first scan chain output signal as a second multiplexer output signal based on the mode selection signal; and,
a second scan chain receiving the second multiplexer output signal and outputting a second scan chain output signal;
wherein the second scan chain group comprises:
a third multiplexer selectively outputting one among the test data and the second scan chain output signal as a third multiplexer output signal based on the mode selection signal;
a third scan chain receiving the third multiplexer output signal and outputting a third scan chain output signal;
a fourth multiplexer selectively outputting one among the test data and the third scan chain output signal as a fourth multiplexer output signal based on the mode selection signal; and,
a fourth scan chain receiving the fourth multiplexer output signal and outputting a fourth scan chain output signal.

19. The test circuit of claim 17, wherein the scan test point group comprises a plurality of scan test point circuits;
wherein the plurality of scan test point circuits comprises a number of scan test point circuits equal to a number of scan chains in the plurality of scan chains in the second scan chain group; and,
wherein each of the scan test point circuits receives a signal output by a corresponding scan chain and the decoder logic circuit output signal and either outputs the signal output by the corresponding scan chain or outputs a stored output signal received from the corresponding scan chain in a previous clock cycle, in response to the decoder logic circuit output signal.

20. The test circuit of claim 19, wherein each of the scan test point circuits comprises:
a fifth multiplexer selectively outputting one among the signal output by the corresponding scan chain and a signal output by a flipflop as a fifth multiplexer output signal base on the decoder logic circuit output signal;
wherein the flipflop receives, stores, and outputs the fifth multiplexer output signal.

21. The test circuit of claim 19, wherein each of the scan test point circuits comprises:
a latch circuit transferring the signal output by the corresponding scan chain or the output signal from the corresponding scan chain received in the previous clock cycle, in response to the decoder logic circuit output signal.

22. A test method adapted for use with a scan based Automatic Test Pattern Generation (ATPG) method, comprising:
generating a test pattern using ATPG;
receiving and decoding a plurality of scan mode signals in a decoder to generate a scan mode signal indicating a test mode or a scan diagnosis mode;
testing electrical and functional characteristics of a scan chain where the scan mode signal indicates the scan diagnosis mode;
wherein testing the electrical and functional characteristics of the scan chain comprises:
generating a plurality of scan test point mode signals comprising information regarding a scan chain having an unknown value whose logic state is not defined, wherein the information includes a number of the scan chain having the unknown value and a location of the unknown value in the scan chain;
decoding the plurality of scan test point mode signals and creating a scan test point control signal; and,
outputting either an output signal received from the scan chain or a stored output received from the scan chain in a previous clock cycle in response to an output signal from the decoder logic circuit; and,
detecting a test source having an error among test sources forming a scan chain where the received scan mode signal indicates the scan diagnosis mode;
wherein detecting the test source having the error among the test sources forming the scan chain comprises:
combining scan chains into a single scan chain where the received scan mode signal indicates the scan diagnosis mode; and,
testing electrical and functional characteristics of the single scan chain and detecting an error location in the single scan chain.

* * * * *